United States Patent
Kalathur et al.

(10) Patent No.: US 11,012,776 B2
(45) Date of Patent: May 18, 2021

(54) VOLUME ADJUSTMENT MODEL DEVELOPMENT

(71) Applicant: International Business Machines Corporation, Armonk, NY (US)

(72) Inventors: Vijai Kalathur, Wappingers Falls, NY (US); Gregory Ecock, White Plains, NY (US); Megan B. Capobianco, Highland, NY (US); Christopher Potter, Poughkeepsie, NY (US); Daniela Regier, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 16/378,657

(22) Filed: Apr. 9, 2019

(65) Prior Publication Data

US 2020/0329311 A1    Oct. 15, 2020

(51) Int. Cl.
| | |
|---|---|
| *H04R 3/04* | (2006.01) |
| *G06F 3/16* | (2006.01) |
| *G06F 3/01* | (2006.01) |
| *G10L 21/034* | (2013.01) |
| *G01S 5/14* | (2006.01) |
| *G01S 11/06* | (2006.01) |
| *H03G 3/30* | (2006.01) |

(52) U.S. Cl.
CPC ............. *H04R 3/04* (2013.01); *G06F 3/011* (2013.01); *G06F 3/017* (2013.01); *G06F 3/167* (2013.01); *G01S 5/14* (2013.01); *G01S 11/06* (2013.01); *G10L 21/034* (2013.01); *H03G 3/3005* (2013.01); *H04R 2420/07* (2013.01); *H04R 2430/01* (2013.01)

(58) Field of Classification Search
CPC ....... G01S 5/14; G01S 11/06; H04R 2430/01; H04R 2420/07; H04R 3/04; G06F 3/011; G06F 3/017; G06F 3/167; H03G 3/3005; G10L 21/034
See application file for complete search history.

(56) References Cited

U.S. PATENT DOCUMENTS

| | | |
|---|---|---|
| 4,476,571 A | 10/1984 | Tokumo et al. |
| 6,859,761 B2 | 2/2005 | Bensky |
| 7,110,558 B1 | 9/2006 | Elliott |

(Continued)

FOREIGN PATENT DOCUMENTS

EP    3192072 A1    7/2017

OTHER PUBLICATIONS

Adib et al., "Capturing the Human Figure Through a Wall", ACM Transactions on Graphics, vol. 34, No. 6, Article 219, Publication Date: Nov. 2015, 13 pages.

(Continued)

*Primary Examiner* — Davetta W Goins
*Assistant Examiner* — Kuassi A Ganmavo
(74) *Attorney, Agent, or Firm* — David K. Mattheis; William H. Hartwell; Nicholas L. Cadmus

(57) ABSTRACT

Controlling the volume of a Virtual Personal Assistant (VPA) by receiving radio frequency (RF) data associated with a user, identifying a location of a user relative to the VPA, creating a volume adjustment model using the data and VPA data, tracking movement of the user based on the data, and adjusting a volume of the VPA according to the volume adjustment model.

20 Claims, 5 Drawing Sheets

(56) References Cited

U.S. PATENT DOCUMENTS

| | | | |
|---|---|---|---|
| 8,452,020 B2 | 5/2013 | Gregg et al. | |
| 8,873,771 B2 | 10/2014 | Carter | |
| 9,439,022 B2 | 9/2016 | Oishi | |
| 9,692,380 B2 | 6/2017 | Herman | |
| 9,929,709 B1 | 3/2018 | Yang et al. | |
| 9,967,724 B1 | 5/2018 | Gan et al. | |
| 10,147,439 B1* | 12/2018 | Kristjansson | G10L 21/034 |
| 10,354,014 B2 | 7/2019 | Sharma | |
| 2005/0046608 A1* | 3/2005 | Schantz | G01S 5/14 |
| | | | 342/127 |
| 2009/0164772 A1* | 6/2009 | Karkaria | G06F 9/445 |
| | | | 713/100 |
| 2011/0069841 A1* | 3/2011 | Angeloff | H03G 3/30 |
| | | | 381/17 |
| 2011/0095875 A1* | 4/2011 | Thyssen | G09G 5/10 |
| | | | 340/407.1 |
| 2012/0020486 A1* | 1/2012 | Fried | H03G 3/32 |
| | | | 381/58 |
| 2012/0114137 A1* | 5/2012 | Tsurumi | H04S 7/303 |
| | | | 381/92 |
| 2013/0010984 A1* | 1/2013 | Hejnicki | H04R 27/00 |
| | | | 381/107 |
| 2014/0334644 A1* | 11/2014 | Selig | G06F 3/165 |
| | | | 381/108 |
| 2015/0010169 A1* | 1/2015 | Popova | H03G 3/20 |
| | | | 381/107 |
| 2016/0044626 A1* | 2/2016 | Li | H04W 64/00 |
| | | | 455/456.1 |
| 2016/0072661 A1* | 3/2016 | Arwe | H04L 29/08468 |
| 2016/0073153 A1* | 3/2016 | Hou | H04N 21/4223 |
| | | | 725/10 |
| 2016/0077794 A1 | 3/2016 | Kim et al. | |
| 2016/0174011 A1* | 6/2016 | Rider | H04S 7/303 |
| | | | 381/303 |
| 2016/0330396 A1* | 11/2016 | Garcia Navarro | H04N 7/15 |
| 2017/0160813 A1 | 6/2017 | Divakaran et al. | |
| 2019/0274003 A1* | 9/2019 | Annamalai | H04L 65/40 |
| 2020/0103486 A1* | 4/2020 | Knaappila | G01S 3/8083 |

OTHER PUBLICATIONS

Mell et al., "The NIST Definition of Cloud Computing", Recommendations of the National Institute of Standards and Technology, Special Publication 800-145, Sep. 2011, 7 pages.

Xin et al., "FreeSense: Indoor Human Identification with Wi-Fi Signals", 2016 IEEE Global Communications Conference (GLOBECOM), 2016, 6 pages.

Bell, Killian, "Apple Patent Hints at Proximity-Based Volume Controls for Future iPhones", May 28, 2013, 2 pages, (https://www.cultofmac.com/228955/apple-patent-hints-at-proximity-based-volume-controls-for-future-iphones/>.

* cited by examiner

VOLUME ADJUSTMENT MODEL DEVELOPMENT

BACKGROUND

The disclosure relates generally to controlling the volume of a virtual personal assistant. The disclosure relates particularly to controlling the volume of a virtual personal assistant according to a model associated with the location and listening habits of a listener.

The advent of Internet of Things (IoT) hub devices in homes, offices and other spaces has been accompanied by the rise of the virtual personal assistant which listen for commands and then execute those commands. Commands may be related to providing audio content (music, news, answers to information requests etc.), as well as shopping, and controlling aspects of a smart environment, lighting, climate controls, environmental security controls. The exchange between a user and the VPA may occur directly via voice commands and audible responses, or may occur using a smart device, with enabling software, communicating via a network, such as the internet, using cloud-based resources and communicating with the IoT hub device by way of a wireless or wired router using network resources. VPA output volume levels may be altered in response to local ambient noise levels or in response to user generated requests.

SUMMARY

Aspects of the invention disclose methods, systems and computer readable media associated with controlling the volume of a Virtual Personal Assistant (VPA). In one aspect, VPA volume is controlled by receiving data associated with a user, identifying a location of a user—relative to the VPA, creating a volume adjustment model (VAM) using the data and VPA data, tracking movement of the user and VPA data, and adjusting a volume of the VPA according to the volume adjustment model.

DETAILED DESCRIPTION

Figure 1:
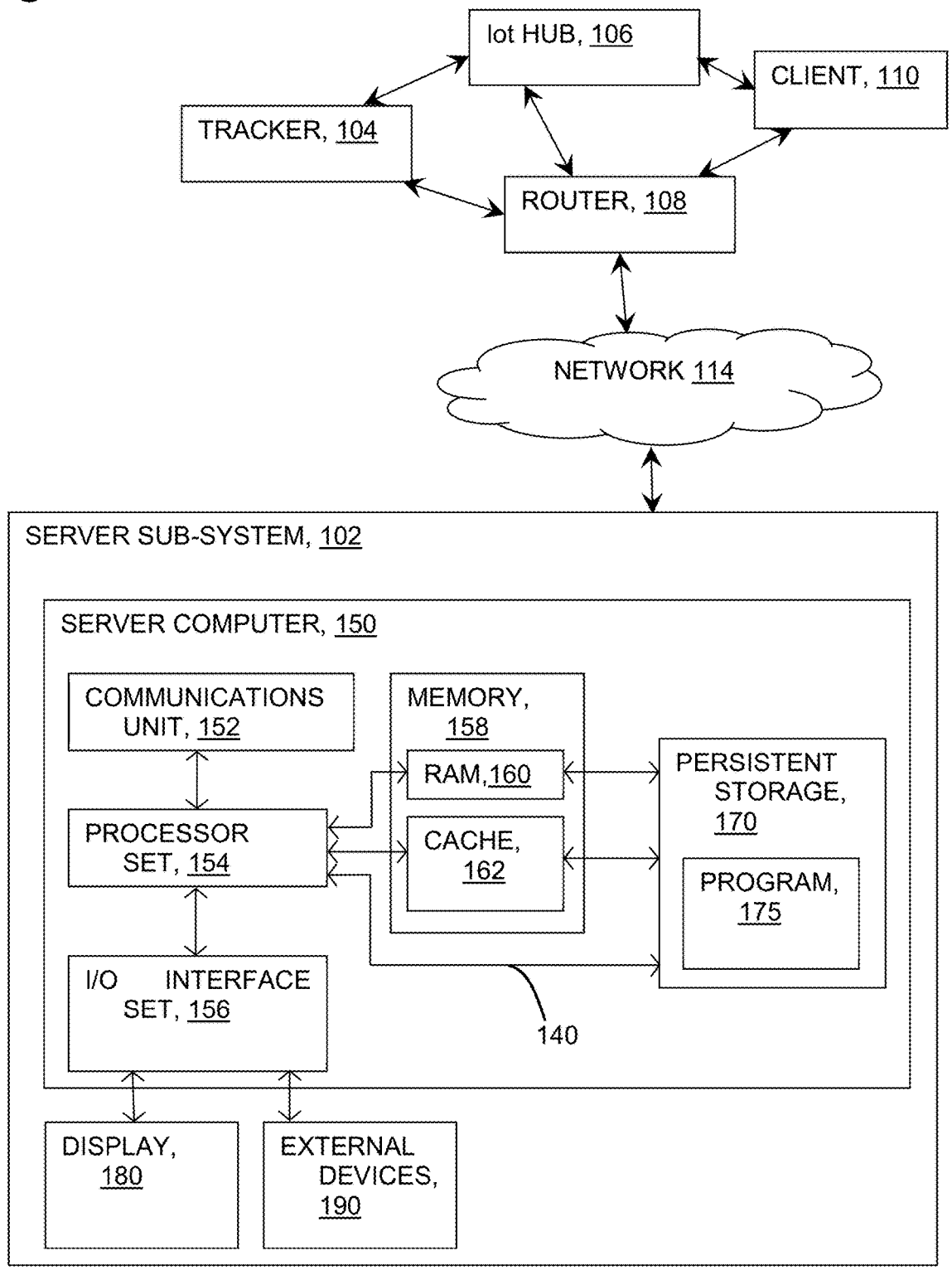
FIG. 1 provides a schematic illustration of a system, according to an embodiment of the invention.

Internet of Things (IoT) device hubs afford a user access to the internet and cloud resources. The access may be via voice command interactions with a Virtual Personal Assistant (VPA). A user may call out to a VPA, initiating a conversation and eliciting an audio response. The user may ask for content of various type, music, sporting event commentary, news, audio books, etc., to be provided by the VPA. The VPA is typically in a fixed location while the user may move throughout the home, office space, or other environment while the content is being provided. Volume controls may be manual requiring a user to tell the VPA to raise or lower the volume of the content. What is needed is an automatic volume control method which adjusts the volume of the VPA audio output as the user changes locations, output content changes, or as different users utilize the VPA.

The IoT hub serves as the VPA interface. The VPA programming may reside locally on the IoT hub or may reside on one or more servers on a network and may also utilize distributed cloud computing resources. As described herein, the location of the IoT hub or other VPA interface device, is considered the location of the VPA. The IoT hub may use a variety of wireless protocols including BLUETOOTH, as well as WIFI IEEE 802.11, to connect local devices as well as the internet via a local router. A wireless telephone capability may be included allowing direct access of network resources without a router. (Note: the term(s) "BLUETOOTH", "IEEE", and/or "WIFI" may be subject to trademark rights in various jurisdictions throughout the world and are used here only in reference to the products or services properly denominated by the marks to the extent that such trademark rights may exist.)

In an embodiment, a user may link a wireless tracking sensor to the IoT hub, either locally, using BLUETOOTH, or via the network by connecting the sensor to a local wireless router which is also connected to the IoT hub, and then to the IoT hub through the hub's connection to the local wireless router. In an embodiment, the tracking sensor may connect to the VPA via the cloud. In this embodiment, the sensor connects to cloud resources using the local router, the VPA is then accessed in the cloud, and responses to the user are then sent from the cloud VPA to the IoT hub over the internet and the local wireless connection. User location and identity data may also include data from infra-red or ultrasonic sensors monitoring the environment of the IoT hub device The strength of the tracking sensor radio frequency (RF) signal may be monitored by the receiving device, either the IoT hub, the local router, or both. The changes in the RF signal strength may be cataloged as the user moves around in the environment shared with the IoT hub. In an embodiment, a volume adjustment model may be created using the signal strength changes sensed by the IoT hub as the user moves in the environment. As the user moves further from the hub or moves into another room or to another floor of the environment, the signal will be attenuated, and the attenuation will be sensed by the hub. Increasing attenuation may be used as an indication that volume should be increased. In an embodiment, the model may be created using a linear relationship with volume level increasing as the user's separation relative to the hub increases. In an embodiment, an exponential relationship may be used as the user's separation increases. The model may continuously adjust the volume, or the model may define boundaries according to attenuation levels where step changes to volume are made as a user crosses an attenuation boundary.

In an embodiment, the tracking sensor signal may be tracked by both the hub and a local router enabling a more precise mapping of the environment using signal data from the two receivers and triangulating calculations. In an embodiment, the hub may monitor the linked tracking sensor signal while the router concurrently tracks a linked second device, smart phone, tablet, etc. associated with the same user. The model may then be adjusted using the new mapping. In an embodiment, the smart phone, tablet, etc., may serve as the tracking sensor by being linked to the hub directly.

In an embodiment, the user may provide additional location information as they move around the environment. In this embodiment, a user may link to the IoT hub and VPA not only by way of the tracking sensor but also by way of a smart device such as a tablet computer, a smart phone, or a BLUETOOTH enabled headset. In this embodiment, the user may provide commentary to the VPA as they move, indicating which room they are now in, or which floor they are on relative the hub to assist the VPA in creating the spatial model of the structure of the environment.

In this embodiment, the VPA may also receive audio feedback directly from the user device by way of a device microphone. In the embodiment, a tracking sensor may further include a microphone. As an example, as a user moves around the environment wearing a linked headset, the VPA may receive input form the microphone of the headset, providing audio signal changes to correlate with the RF signal changes. As the VPA adjusts the volume, either in response to a user command, or at the command of the created volume adjustment model, the model can receive feedback through the linked microphone. In an embodiment, the tracking sensor RF signal may be monitored by a local router and the VAM may be created according to router sensed attenuation in correlation with microphone sensed audio attenuation received by the hub.

In an embodiment, additional data may be collected by the VPA. For example, the additional data may include: identification of the particular user, types of voice commands given by the user, estimated distance from the VPA when commands are given, identification of other users when commands are given, and tracking data associated with other users present when commands are given.

In an embodiment, the model creation also considers: type of content being played when commands are given (news, sports, music, books), user preferences associated with specific content or content types (favorite songs, or types of news content), ambient noise level surrounding the IoT hub, the time of day, weekday (weekday volumes versus weekend volumes), or date (different volumes of different days of the year).

In an embodiment, the model may include consideration for the structural details of the environment, walls, multiple floor, doorways, etc. by way of monitoring RF data associated with different user locations and differences in user volume preferences associated with similar distances from the device. As an example, a user 15 feet from a device while in the same room can have a different volume preference for that distance than the same user 15 feet from the device while in another room or on another floor of the structure.

In an embodiment, a user may provide data regarding the environment. The user may indicate that the VPA/IoT hub resides in an apartment, a single-story house, a multi-story house, an office or other pre-defined environment types. The user may provide layout information regarding the rooms of the environment. The nature of the environment may be input to the model creation for use in conjunction with the attenuation data.

In an embodiment, multiple tracking sensors may be linked to the IoT, each tracking sensor may be associated with a different user. In an embodiment, data such as RF Capture may be used to define profiles for multiple users in the environment. The user's VPA volume adjustment model (VAM) profile may be developed to tailor the volume control model for each user. Table 1 provides an illustration of the user profiles according to an embodiment of the invention.

TABLE 1

Preferred volume level profiles by individual and distance

| Person | Distance (ft) | | | |
|---|---|---|---|---|
| | 10 | 25 | 40 | 55 |
| Chris | 50 | 60 | 70 | 80 |
| Daniela | 60 | 70 | 80 | 90 |
| Greg | 50 | 60 | 70 | 80 |
| Megan | 40 | 50 | 60 | 70 |
| Vijai | 60 | 70 | 80 | 90 |

In an embodiment, after receiving a command, the device determines who issued the command, the content being played, and the distance of the issuer from the device. In this embodiment, the VAM may be prepopulated with default volume-distance levels. For an issuer having a profile in the VAM, and when the issuer is the only person sensed in the vicinity of the device, the VAM refers to the issuer's profile and adjusts the volume according to the content and distance for the issuer. When the issuer subsequently requests a manual volume change, the VAM profile for the issuer can be adjusted for the current content, distance, issuer combination by an increment, such as 1, up or down depending upon the manual volume command received from the issuer.

In an embodiment where multiple users are near the device, after receiving a command, the VAM determines which user issued the command, the content being played and the distance of the user from the device. The VAM also determines the distance of the closest person to the device. In this embodiment, the profile of the closest person will define an upper limit for the volume of the current content according to the distance of the closest person. The VAM responds to the input data using either default settings for new users, or the current profile of the user from the database of the VAM. The VAM adjusts the volume to the lesser of the volume cap associated with the closest user and the desired volume according to the command issuer's profile and distance from the device. As an example: user A requests music from a distance of 30 feet, and their VAM profile indicates a volume setting of 80 for music at that distance. User B is sensed at 15 feet, and user C is sensed at 10 feet. User C has a maximum volume setting for music at 10 feet of 7. The VAM then limits the volume at 7, due to the profile of the closest user. User A may request a manual increase of the volume to 8, user C may accept this change and the VAM may be adjusted for the scenario where A and C are present by raising the maximum volume for user C at 10 feet when user A is also present.

In an embodiment, the VAM may adjust the volume according to a weighted average of the preferences of all users in the vicinity of the device. In this embodiment, a formula of: [command issuer's volume preference]*0.50+ [((sum of other user's volume preferences)/number of other users)*0.50] can be used to determine a tentative setting subject to a safety over ride according to the maximum safe volume for the closest user.

In this embodiment, command issuer A with a preferred volume of 70 at 30 feet. Also present are: (i) user B, at 15 feet, with a preferred volume of 60 at 15 feet, (ii) user C, at 5 feet, with a preferred volume of 40 at 5 feet, and (iii) user D, at 2 feet, with a preferred volume of 20 at 2 feet. The VAM default safety profile provides a maximum safe volume for 2 feet of 40. The Volume level will be calculated as: [70*0.50]+[((60+40+20)/3)*0.50]=55, the volume will be set to 40 based upon the maximum safe volume level for a user at 2 feet.

Had user C issued the command, the volume would be calculated as: [40*0.50]+[((70+60+20)/3)*0.50]=45, so with a maximum safe volume for 2 feet at 40, the volume will again be set to 40. In this embodiment, the distances of the users may be polled repeatedly, and additional volume adjustments can be made as warranted. Manual requests for adjustments may also be processed and user profile adjustments made as new data is provided to the VAM regarding user preferences.

In an embodiment, the model may differentiate users using RF CAPTURE data or WIFI Channel State Information identifications, tracking sensors, or the model may include a voice recognition module wherein voice signatures are recorded for each user. As the VPA receives subsequent commands, a comparison may be made to determine which user is issuing the command. The model may then select the appropriate user profile before determining if volume adjustments are needed according to distance, content, etc. (Note: the term(s) "WIFI" and "RF CAPTURE" may be subject to trademark rights in various jurisdictions throughout the world and are used here only in reference to the products or services properly denominated by the marks to the extent that such trademark rights may exist.)

In an embodiment, the environment may be subdivided into different zones for each individual based upon the distance determined by signal strength. As an individual's location is monitored moving from a first zone to a second zone using RF CAPTURE or WIFI channel state data., the model can evaluate the need for changes in IoT output volume and adjust the volume if necessary.

In an embodiment, the VAM may adjust the hub volume according to user location changes, or according to changes in content, listeners present, or other parameters used in creating the model. The VPA monitors the input parameters and adjusts the hub volume as changes in the inputs warrant.

FIG. 1 provides a schematic illustration of exemplary network resources associated with practicing the disclosed inventions. Functionality of embodiments of the inventions herein may be practiced in the processors of any of the disclosed elements which process an instruction stream. As shown in the figure, a networked tracking sensor 104, Internet of Things (IoT) hub 106, and Client device 110 connect wirelessly to server sub-system 102 via router 108 and network 114. Tracking sensor 104 and client device 110 each connect wirelessly to IoT hub 106. As shown in FIG. 1, server sub-system 102 comprises a server computer 150. FIG. 1 depicts a block diagram of components of server computer 150 within a networked computer system 1000, in accordance with an embodiment of the present invention. It should be appreciated that FIG. 1 provides only an illustration of one implementation and does not imply any limitations with regard to the environments in which different embodiments can be implemented. Many modifications to the depicted environment can be made.

Server computer 150 can include processor(s) 154, cache 162, memory 158, persistent storage 170, communications unit 152, input/output (I/O) interface(s) 156 and communications fabric 140. Communications fabric 140 provides communications between cache 162, memory 158, persistent storage 170, communications unit 152, and input/output (I/O) interface(s) 156. Communications fabric 140 can be implemented with any architecture designed for passing data and/or control information between processors (such as microprocessors, communications and network processors, etc.), system memory, peripheral devices, and any other hardware components within a system. For example, communications fabric 140 can be implemented with one or more buses.

Memory 158 and persistent storage 170 are computer readable storage media. In this embodiment, memory 158 includes random access memory 160 (RAM). In general, memory 158 can include any suitable volatile or non-volatile computer readable storage media. Cache 162 is a fast memory that enhances the performance of processor(s) 154 by holding recently accessed data, and data near recently accessed data, from memory 158.

Program instructions and data used to practice embodiments of the present invention, e.g., the volume adjustment model 175, are stored in persistent storage 170 for execution and/or access by one or more of the respective processor(s) 154 of server computer 150 via cache 162. In this embodiment, persistent storage 170 includes a magnetic hard disk drive. Alternatively, or in addition to a magnetic hard disk drive, persistent storage 170 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 170 may also be removable. For example, a removable hard drive may be used for persistent storage 170. Other examples include optical and magnetic disks, thumb drives, and smart cards that are inserted into a drive for transfer onto another computer readable storage medium that is also part of persistent storage 170.

Communications unit 152, in these examples, provides for communications with other data processing systems or devices, including resources of client computing devices 104, and 110. In these examples, communications unit 152 includes one or more network interface cards. Communications unit 152 may provide communications through the use of either or both physical and wireless communications links. Software distribution programs, and other programs and data used for implementation of the present invention, may be downloaded to persistent storage 170 of server computer 150 through communications unit 152.

I/O interface(s) 156 allows for input and output of data with other devices that may be connected to server computer 150. For example, I/O interface(s) 156 may provide a connection to external device(s) 190 such as a keyboard, a keypad, a touch screen, a microphone, a digital camera, and/or some other suitable input device. External device(s) 190 can also include portable computer readable storage media such as, for example, thumb drives, portable optical or magnetic disks, and memory cards. Software and data used to practice embodiments of the present invention, e.g., volume adjustment model 175 on server computer 150, can be stored on such portable computer readable storage media and can be loaded onto persistent storage 170 via I/O interface(s) 156. I/O interface(s) 156 also connect to a display 180.

Display 180 provides a mechanism to display data to a user and may be, for example, a computer monitor. Display 180 can also function as a touch screen, such as a display of a tablet computer.

Figure 2:
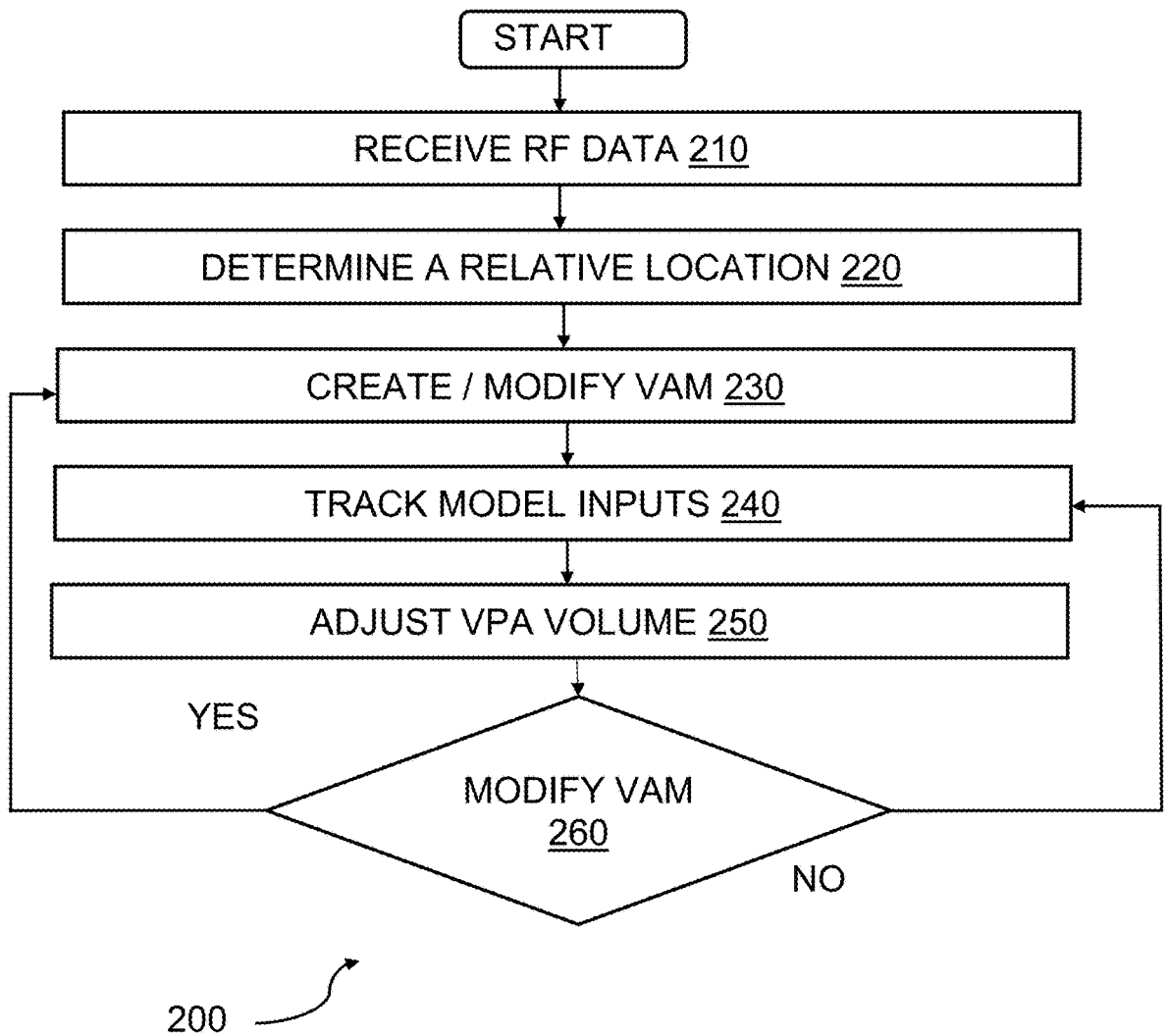
FIG. 2 provides a flowchart depicting an operational sequence, according to an embodiment of the invention.

FIG. 2 provides a flowchart 200, illustrating exemplary activities associated with the practice of the disclosure. After program start, RF data is received at 210. The RF data may be received directly from a linked tracking sensor, may be data associated with tracking a device by a router and submitting the tracking data to the hub, or may be from one or more RF CAPTURE sensors in the environment. In an embodiment, WIFI Channel State Information may be used to determine user(s) locations. A location of the user relative to the VPA is determined at 220 according to RF signal attenuation as a user moves in the common environment of the user and the VPA.

A volume adjustment model (VAM) is created at 230 using the RF data as well as data associated with individual users, types of voice commands given, and the locations and identities of the user and other people in the environment. The VAM may also consider: content types, user preferences for volume levels, ambient noise in the environment, the environment layout, the time of day, day of the week and calendar date.

After the VAM is created, it is implemented to control hub output volume according to model parameters: user, location, content, etc. Users' locations, users present, content played, etc., are tracked at 240 and volume adjustments are made at 250. As model-based adjustments are made based upon changes in model input parameters, the model tracks manual adjustments to volume requested by the user. Such manual adjustments are used to refine the model to reduce the need for future manual adjustments. After a model-based adjustment, the model is evaluated at 260 to determine if modifications to the model are needed. If modifications are needed, based upon manual adjustment requests, the method returns to 230 and the VAM is modified. If no changes are needed, the method returns to tracking the user's location anticipating further VAM-initiated volume changes.

In an embodiment, the VAM may be continuously evaluated for efficacy and modified to improve the performance of the model in terms of providing audio output at a desired or acceptable volume level. In this embodiment, the VPA tracks manual volume adjustments associated with model-based changes. As an example, after a user moves to a new zone and the VAM adjusts the output volume, the VPA receives a manual volume request to increase the volume, indicating that the model-based increase was not sufficient, or to decrease the volume, indicating the model-based increase was not needed. The nature of the content will also be monitored to differentiate content-based preferences in addition to distance-based preferences. In this embodiment, the model will further track a user's location to determine if a user first moves toward the hub before requesting a manual volume change. In an example where the model-based change is not needed but the user is in an area where the VPA cannot hear a voice request, the user must first move toward the VPA and then give the command to undo the model-based volume change.

Figure 3:
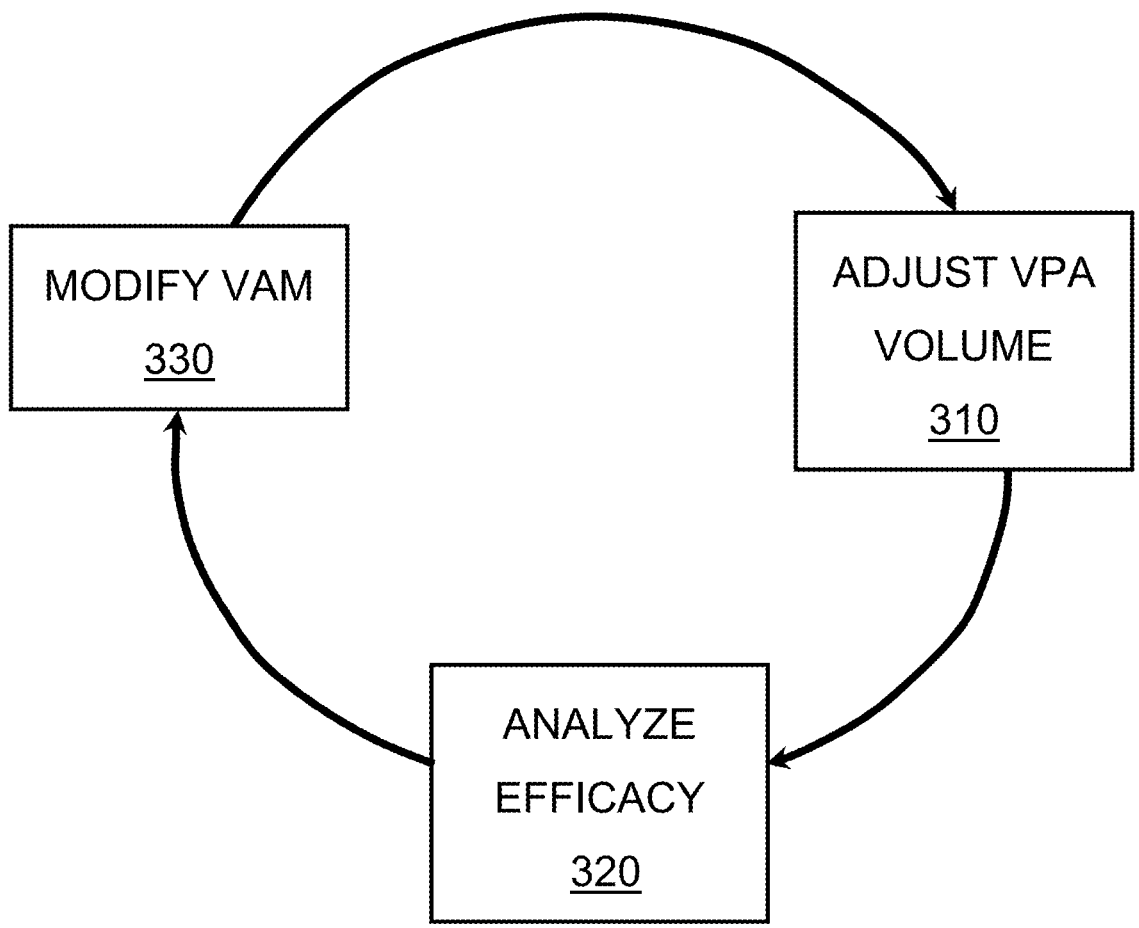
FIG. 3 depicts a schematic view of the iterative operations, according to an embodiment of the invention.

FIG. 3 provides an illustration of the iterative process used to evaluate and modify the model to continuously improve its efficacy. At 310, a volume adjustment is made according to the VAM and a change in the user's location, user identification, content played, etc. At 320 the VAM efficacy is evaluated by determining if manual user requests for volume adjustments were received after the model-based adjustment. If a manual adjustment was made, the VAM is modified at 330 according to the manual requests to alter volume after the model-based adjustment.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
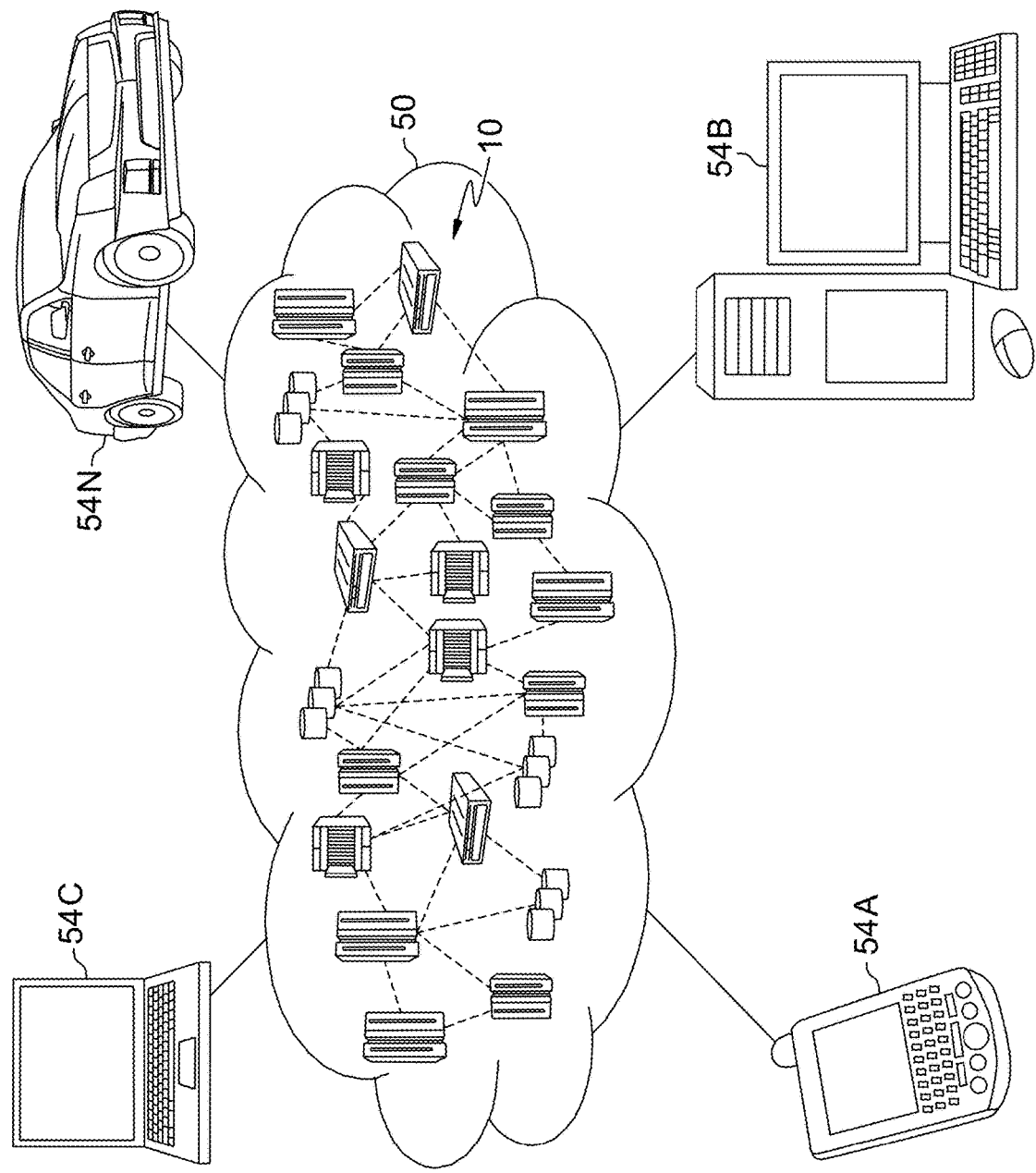
FIG. 4 depicts a cloud computing environment, according to an embodiment of the invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
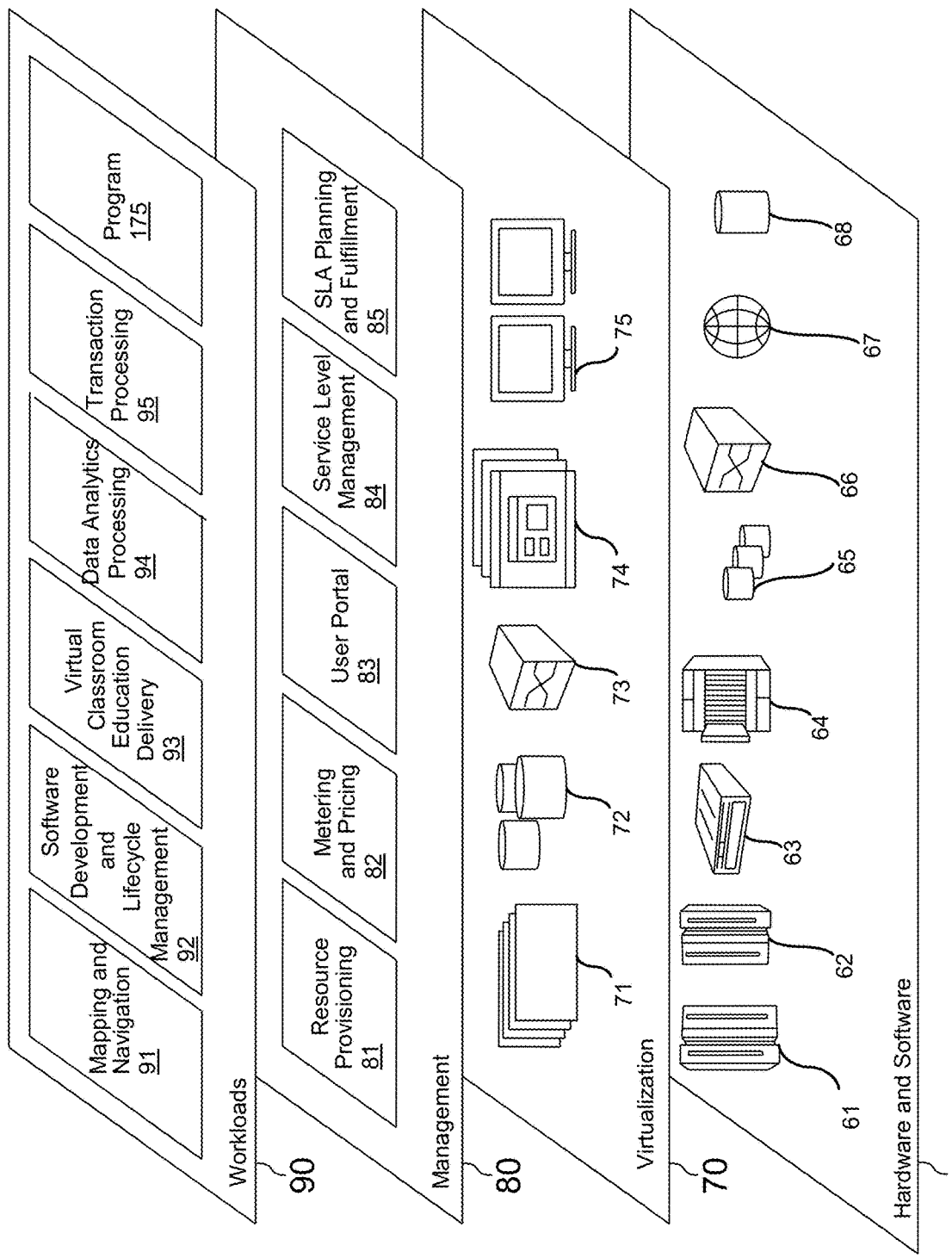
FIG. 5 depicts abstraction model layers, according to an embodiment of the invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and volume adjustment model 175.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for controlling a VPA (virtual personal assistant) volume, the method comprising:
receiving, by one or more computer processors, radio frequency (RF) data associated with a tracking sensor;
identifying, by one or more computer processors, a location of a user relative to an IoT (Internet of Things) hub, at least in part according to RF data;
creating, by one or more computer processors, a volume adjustment model for the VPA according to RF data signal strength changes, wherein the volume adjustment model comprises user profiles for a plurality of users, wherein the user profiles comprise user volume level preferences according to content type and distance;
sensing, by one or more computer processors, RF data signal attenuation;
sensing, by one or more computer processors, the location of multiple users; and
adjusting, by one or more computer processors, a volume of the VPA according to multiple user profiles of the volume adjustment model, each of the multiple user profiles associated with one of the multiple users, and the RF data signal attenuation.

2. The method according to claim 1 further comprising:
estimating efficacy, by one or more computer processors, of the volume adjustment model at least in part according to RF and VPA data received after adjusting the volume of the VPA.

3. The method according to claim 2, wherein the VPA data includes volume adjustment requests received from the user after adjusting the volume of the VPA.

4. The method of claim 1 wherein creating the volume adjustment model further includes:
creating the volume adjustment model according to elements selected from the group consisting of: content being played by the VPA, user preferences for volume level for the content being played, ambient noise levels surrounding the VPA, layout of the location of the VPA, a time of day, a weekday, and a date.

5. The method according to claim 1, further comprising:
adjusting, by one or more processors, the volume of the VPA according to a weighted average of user preferences.

6. The method according to claim 1 further comprising adjusting, by one or more processors, the volume of the VPA according to a distance between a command issuer and the VPA and a distance between a closest user and the VPA.

7. The method according to claim 1 further comprising receiving audio input associated with the RF data from the tracking sensor.

8. A computer program product for controlling a VPA (virtual personal assistant), the computer program product comprising one or more computer readable storage devices and program instructions stored on the one or more computer readable storage devices, the stored program instructions comprising:
programmed instructions for receiving RF data associated with a tracking sensor;
programmed instructions for identifying a location of a user relative to an IoT hub;
programmed instructions for creating a volume adjustment model for the VPA according to RF data signal strength changes, wherein the volume adjustment model comprises user profiles for a plurality of users, wherein the user profiles comprise user volume level preferences according to content type and distance;
programmed instructions for sensing RF data signal attenuation;
programmed instructions for sensing the location of multiple users; and programmed instructions for adjusting a volume of the VPA according to multiple user profiles of the volume adjustment model, each of the multiple user profiles associated with one of the multiple users, and the RF data signal attenuation.

9. The computer program product according to claim 8, the stored program instructions further comprising:
programmed instructions for estimating efficacy of the volume adjustment model at least in part according to RF and VPA data received after adjusting the volume of the VPA.

10. The computer program product according to claim 9, wherein the VPA data includes volume adjustment requests received from the user after adjusting the volume of the VPA.

11. The computer program product according to claim 8, the stored program instructions further comprising:
programmed instructions for adjusting the volume of the VPA according to a weighted average of user preferences.

12. The computer program product according to claim 8, wherein creating the volume adjustment model further includes:
creating the volume adjustment model according to elements selected from the group consisting of: content being played by the VPA, user preferences for volume level for the content being played, ambient noise levels surrounding the VPA, layout of the location of the VPA, a time of day, a weekday, and a date.

13. The computer program product according to claim 8, the stored program instructions further comprising:
program instructions for adjusting the volume of the VPA according to a distance between a command issuer and the VPA and a distance between a closest user and the VPA.

14. A computer system for controlling a VPA (Virtual Personal Assistant) volume, the computer system comprising:
one or more computer processors;
one or more computer readable storage devices;
program instructions stored on the one or more computer readable storage devices for execution by the at least on computer processor, the stored program instructions comprising:
programmed instructions for receiving RF data associated with a tracking sensor;
programmed instructions for identifying a location of a user relative to an IoT hub;
programmed instructions for creating a volume adjustment model for the VPA according to RF data signal strength changes, wherein the volume adjustment model comprises user profiles for a plurality of users, wherein the user profiles comprise user volume level preferences according to content type and distance;
programmed instructions for sensing RF data signal attenuation;
programmed instructions for sensing the location of multiple users; and
programmed instructions for adjusting, by one or more computer processors, a volume of the VPA according to multiple user profiles of the volume adjustment model, each of the multiple user profiles associated with one of the multiple users, and the RF data signal attenuation.

15. The computer system according to claim 14, the stored program instructions further comprising:
programmed instructions for estimating efficacy of the volume adjustment model at least in part according to RF and VPA data received after adjusting the volume of the VPA.

16. The computer system according to claim 15, wherein the VPA data includes volume adjustment requests received from the user after adjusting the volume of the VPA.

17. The computer system according to claim 14, the stored program instructions further comprising:
programmed instructions for adjusting the volume of the VPA according to a weighted average of user preferences.

18. The computer system according to claim 14, wherein creating the volume adjustment model further includes:
creating the volume adjustment model according to elements selected from the group consisting of: content being played by the VPA, user preferences for volume level for the content being played, ambient noise levels surrounding the VPA, layout of the location of the VPA, a time of day, a weekday, and a date.

19. The computer system according to claim 14, the stored program instructions further comprising:
   program instructions for adjusting the volume of the VPA according to a distance between a command issuer and the VPA and a distance between a closest user and the VPA.

20. The computer system according to claim 14, the stored program instructions further comprising:
   receiving audio input associated with the RF data from the tracking sensor.

* * * * *